US009349889B2

(12) United States Patent
Rihani

(10) Patent No.: US 9,349,889 B2
(45) Date of Patent: May 24, 2016

(54) HIGH OPERATING TEMPERATURE RESONANT TUNNELLING QUANTUM WELL PHOTODETECTOR

(71) Applicant: Sharp Kabushiki Kaisha, Osaka-shi, Osaka (JP)

(72) Inventor: Samir Rihani, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/437,867

(22) PCT Filed: Oct. 23, 2013

(86) PCT No.: PCT/JP2013/006262
§ 371 (c)(1),
(2) Date: Apr. 23, 2015

(87) PCT Pub. No.: WO2014/064930
PCT Pub. Date: May 1, 2014

(65) Prior Publication Data
US 2015/0280035 A1  Oct. 1, 2015

(30) Foreign Application Priority Data
Oct. 24, 2012  (GB) .................................. 1219118.5

(51) Int. Cl.
*H01L 31/0352* (2006.01)
*H01L 27/146* (2006.01)
*H01L 31/102* (2006.01)

(52) U.S. Cl.
CPC .. *H01L 31/035236* (2013.01); *H01L 27/14649* (2013.01); *H01L 27/14652* (2013.01); *H01L 31/0352* (2013.01); *H01L 31/035209* (2013.01); *H01L 31/102* (2013.01)

(58) Field of Classification Search
None
See application file for complete search history.

(56) References Cited

U.S. PATENT DOCUMENTS 5,457,709 A  10/1995  Capasso et al.
5,901,168 A   5/1999  Baillargeon et al.
(Continued)

FOREIGN PATENT DOCUMENTS

FR  2 827 709 B1  11/2003
JP  2013-41933 A   2/2013

OTHER PUBLICATIONS

English translation of Official Communication issued in corresponding International Application PCT/JP2013/006262, mailed on Dec. 10, 2013.
(Continued)

*Primary Examiner* — Fei Fei Yeung Lopez
(74) *Attorney, Agent, or Firm* — Keating & Bennett, LLP

(57) ABSTRACT

An semiconductor structure comprises a first quantum well having a first state (E3) with an energy that is greater than an energy of a lower state (E1) by a first energy difference, a quantum well structure (100) adjacent to the first quantum well and having at least a second state (E4) having an energy level which is resonant with the first state (E3) of the first quantum well, a second quantum well having at least a third state (E2) to collect electrons from the second state (E4) of the quantum well structure through a non-radiative mechanism and a fourth state (E5). An energy of the fourth state of the second quantum well is greater than an energy of the third state (E2) by a second energy difference. The structure can absorb two photons, one in the first quantum well by excitation of a carrier from the lower energy state (E1) to the first state (E3) and another in the second quantum well by excitation of a carrier from the third state (E2) to the fourth state (E5). The quantum well structure provides efficient extraction of excited carriers from the first quantum well.

19 Claims, 7 Drawing Sheets

(56) References Cited

U.S. PATENT DOCUMENTS

| | | | |
|---|---|---|---|
| 6,148,012 | A | 11/2000 | Capasso et al. |
| 6,211,529 | B1 | 4/2001 | Gunapala et al. |
| 6,433,354 | B1 | 8/2002 | Kuan et al. |
| 6,521,967 | B1 | 2/2003 | Bandara et al. |
| 2005/0058168 | A1* | 3/2005 | Hu .......................... H01S 5/22 372/44.01 |

OTHER PUBLICATIONS

Tsai, K. et al., "Two-Color Infrared Photodetector Using GaAs/AlGaAs and Strained InGaAs/AlGaAs Multiquantum Wells", Applied Physics Letter, vol. 62, 1993, pp. 3504-3506.

Levine, B., "Quantum-well Infrared Photodetectors", Journal of Applied Physics, vol. 74, R1, 1993, 82 pages.

Castellano, F. et al., "Improving the Operation Temperature of Semiconductor-based Terahertz Photodetectors: A Multiphoton Design", Applied Physics Letters 92, 091108, 2008, 4 pages.

Castellano, F. et al., "Sequential Multiphoton Strategy for Semiconductor-based Terahertz Detectors", Journal of Applied Physics 104, 123104, 2008, 11 pages.

Liu, H., "Quantum Well Infrared Photodetector Physics and Novel Devices", Semiconductors and Semimetals, vol. 62, Academic Press, 2000, pp. 129-196.

Oktyabrsky, S. et al., "Characteristics of Integrated QWIP-HBT-LED Up-Converter", IEEE Transactions on Electron Devices, vol. 50, No. 12, Dec. 2003, pp. 2378-2387.

Oum, J. et al., "Quantum-Well Infrared Phototransistor with pHEMT Structure", IEEE Electron Device Letters, vol. 26, No. 8, Aug. 2005, pp. 527-529.

Ryzhii, V., "Unipolar Darlington Infrared Phototransistor", Jpn. Journal of Applied Physics, vol. 36, Part 2, No. 4A, Apr. 1, 1997, pp. L415-L417.

Schneider, H. et al., "Ultrasensitive Femtosecond Two-Photon Detector with Resonantly Enhanced Nonlinear Absorption", Opitcs Letters, vol. 30, No. 3, Feb. 1, 2005, pp. 287-289.

\* cited by examiner

HIGH OPERATING TEMPERATURE RESONANT TUNNELLING QUANTUM WELL PHOTODETECTOR

TECHNICAL FIELD

The invention relates to an infrared photodetector, more specifically to a resonant tunnelling multi-photon quantum well infrared photodetector with improved temperature performance.

BACKGROUND ART

Infrared (IR) detection and imaging systems are becoming increasingly important in many different applications including civil, industrial, automotive, medical, astronomical, law enforcement and public safety sectors. Generally IR radiation can be detected by photon or thermal detectors.

Thermal detectors absorb IR radiation which induces a change in the device temperature; this effect can be measured through a change in a physical property of the detector such as resistance or polarization for example. The main advantage of thermal infrared detectors lies in the fact that they can operate at room temperature and hence avoid the cost of cryogenic cooling. However, thermal detectors suffer from a number of disadvantages which limit their performance including slow response, low sensitivity, necessity for vacuum packaging and thermal insulation.

In a photon detector, incident IR photons get absorbed by carriers (electrons or holes) enabling them to make a transition from a non-conducting band to a conducting band within the device structure. The output signal can then be measured as photocurrent or a photovoltage across the detector. The most widely used IR photodetector is based on the HgCdTe ternary semiconductor alloy, which is characterized with high quantum efficiency (>70%) and wide band spectral sensitivity. However, as with most IR photodetector HgCdTe based detectors cannot operate at room temperature and rely on cryogenic cooling for their operation.

A recently introduced IR photodetector known as Quantum Well Infrared Photodetector (QWIP), has attracted a lot of attention due to its superior performance offering fast response, large sensitivity and multi-spectral response capability. QWIP technology is based on the well developed III-V material system with a large industrial base offering high uniformity and yield due to the mature micro-fabrication technology. Therefore, two-dimensional (2D) QWIP based Focal Plane Arrays (FPAs) are much easier and less expensive to fabricate than HgCdTe based FPAs. Furthermore, in the long wavelength and very long wavelength IR applications, HgCdTe suffers from serious problems due to non-uniformity and low process yield. However, the main disadvantage of QWIP technology is the requirement of cooling to cryogenic temperatures typically below 80K.

SUMMARY OF INVENTION

Technical Problem

Therefore, there is a real need for a high performance high operating temperature IR photodetector without substantial cooling requirements, for the technology to be widely adopted. Since HgCdTe type detectors rely on IR absorption across the band gap, their properties, including operating temperature, are intrinsically locked into the semiconductor, and dictated primarily by the band gap of the material. Hence, there is very little one can do to improve the temperature performance of HgCdTe IR photodetectors. On the other hand, QWIPs rely on band gap engineering of intersubband transitions in multiple quantum well structures realized by the growth of synthetic semiconductors using techniques such as Molecular Beam Epitaxy (MBE) and Metal Organic Chemical Vapour Deposition (MOCVD). Consequently, many electronic and optical properties of intersubband based devices can be engineered at the fundamental level simply by changing the layer pattern and sequence of the nano-structured material. Due to this extra functionality offered by QWIP devices, using engineering of intersubband transitions, different approaches have emerged in order to tackle the problem of low temperature operation for such IR photodetectors.

Solution to Problem

A first aspect of the invention provides a quantum well semiconductor structure comprising: a first quantum well having at least a first state, an energy of the first state being greater than an energy of a lower energy state by a first energy difference; a quantum well structure adjacent to the first quantum well and having at least a second state having an energy level which is resonant with the first state of the first quantum well; and a second quantum well within or adjacent to the quantum well structure, and having at least a third state to collect electrons from the second state of the quantum well structure through a non-radiative mechanism and a fourth state, an energy of the fourth state of the second quantum well being greater than an energy of the third state by a second energy difference.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings. Furthermore, it will be understood, by those skilled in the art, that various modifications, additions and alterations may be made to the invention without departing from the spirit and scope of the invention as defined in the claims.

The main factor dictating the operation temperature of QWIPs is the dark current contribution to the noise, see for example U.S. Pat. No. 6,211,529 issued to Gunapala et al. on Apr. 3, 2001, or B. F. Levien. J. Appl. Phys, 74:R1, 1993, and references therein. The dark current in a multiple quantum well (MQW) device, such as a QWIP, is a strong function of temperature, and as the temperature increases, the thermionic emission of electrons across the potential barriers dominates the dark current. This thermionic dark current, $I_{th}$ can be expressed in a simplified form as $$I_{th} \propto \exp\left(-\frac{V_b}{k_B T}\right) \quad (1)$$

where $V_b$ is the quantum well barrier height,

T is the temperature, and $k_B$ is the Boltzmann constant. The above equation explains the exponential increase in the dark current as a function of temperature, hence the importance of cooling for the operation of QWIP devices.

Consequently, most prior art QWIPs have focused on reducing the dark current to enable the detector to operate at elevated temperatures, albeit with little success beyond 80K. U.S. Pat. No. 6,433,354 proposes a QWIP device having front and rear AlGaAs barrier blocking layers to reduce the dark current; however the device still needs to be cooled down using liquid nitrogen.

French patent application number 0109754 proposes a new type of QWIP namely the Quantum Cascade Detector. Here, the device structure is designed to operate in photovoltaic mode by ensuring the cascade of photo-generated electrons through a coupled quantum well structure. In this proposal, the dark current is also reduced due to the absence of an applied voltage across the device. However, the detector still requires cooling since the primary contribution to the dark current is through thermionic emission across the potential barriers.

Recently, F. Castellano et al in APL 92, 091108, (2008) and JAP 104, 123104, (2008) have theoretically discussed a multi-photon based QWIP for application in terahertz (30 um-300 um) (the word "um" represents "micro meter") detection. The use of multi-photon detection strategy may reduce the dark current in QWIP based devices by several orders of magnitude, due to mainly the use of deep wells with high barrier potentials. This should enable the detector to work at higher temperatures compared to conventional single photon based QWIPs. The suggested structure is based on a quantum well having a ladder of equally spaced bound states, whose step is tuned to the target THz detection frequency.

In one embodiment U.S. Pat. No. 6,521,967 proposes a QWIP structure with two photon absorptions per transition using a double quantum well structure, as shown in FIG. 7. Electrons in the first (left-hand) well are excited from ground level E1 of the first well to an excited level E3 of the first well by absorption of a first photon. The excited electrons relax and populate the ground state E2 of the second (right) quantum well, from where they may be excited to an excited level E4 of the second well by absorption of a second photon. The barrier heights and well thicknesses are chosen such that E3−E1=E4−E2. Again, employing multi-photon (two photons in this case) for IR detection allows the use of higher potential barriers which significantly reduces the dark current enabling the device to operate at elevated temperatures.

Although it is possible to use structures similar to the ones presented in U.S. Pat. No. 6,521,967 or in APL 92, 091108, (2008) and JAP 104, 123104 for multi-photon detection of terahertz and very long wavelength infrared radiation VLIR (>16 um), implementing the same concept at shorter wavelength IR radiation is not straight forward. This is because at terahertz and VLIR, the energies involved are less than the optical phonon (LO-phonon) energy of the semiconductor used (for example ~36 meV in GaAs). As soon as the energies involved in the transitions become substantially larger than the LO-phonon energy, an ultrafast sub-picosecond scattering mechanism is initiated, which significantly reduces the carrier lifetime in the excited states, and causes photo-excited carriers to relax back to the ground state of the first quantum well. This will therefore prevent carriers from escaping the well, and significantly reduce the photocurrent generated by the absorption of IR. As a result, both the efficiency and signal to noise ratio of the detector will be greatly compromised.

One of the key objectives of this invention is to provide a multi-photon detection QWIP structure where carrier relaxation back to the ground state is greatly reduced, hence taking full advantage of the multi-photon detection concept and allowing the operation of the detector at elevated temperatures. Furthermore, the invention enables the QWIP to work at LWIR and MWIR, without being affected by ultrafast sub-picosecond scattering of carriers back to the ground state. An important objective of this invention is also to provide a structure capable of efficient infrared absorption in order to enhance the performance of current solar cells. In addition to the above, further objectives, key features and advantages of current invention will be disclosed in the following sections.

BRIEF DESCRIPTION OF DRAWINGS

In the annexed drawings, like references indicate like parts or features.

DESCRIPTION OF EMBODIMENTS

Figure 1A:
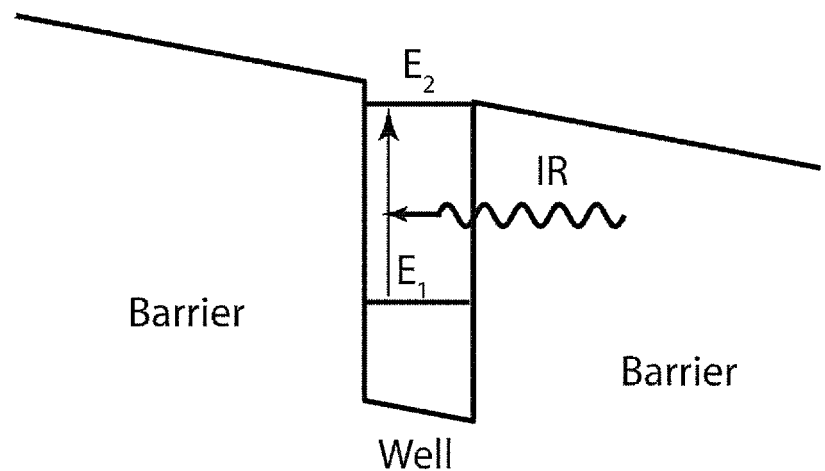
FIG. 1(a) A schematic of the conduction band diagram of a conventional QWIP.

A conventional QWIP is made of a repeat, typically more than 40, of quantum wells and barriers, where each quantum well has at least two bound states $E_1$ and $E_2$, with $E_2$ being substantially at the top of the well. FIG. 1 (a) is a schematic diagram of the conduction band of such quantum well. The energy difference between levels $E_1$ and $E_2$ corresponds to the wavelength of the infrared radiation to be detected. Carriers are photo-excited from $E_1$ to $E_2$ by absorbing the incident IR. A bias voltage is applied across the QWIP so that photo-excited electrons to level $E_2$ efficiently escape the well and form a photocurrent. The dark current for this conventional QWIP is given according to equation (1).

Figure 1B:
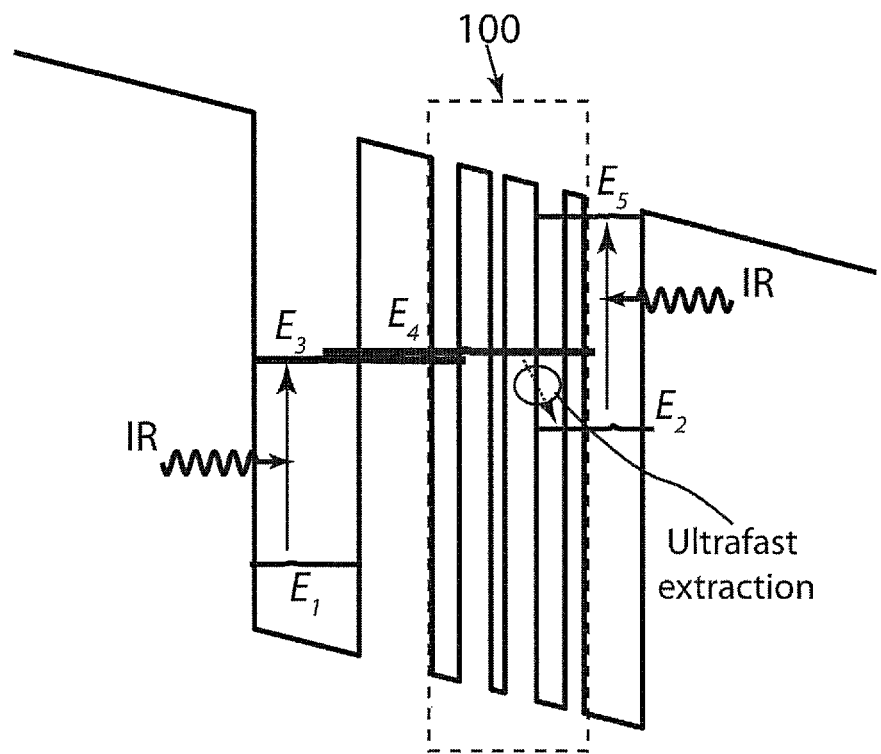
FIG. 1(b) A schematic of the conduction band diagram of resonant tunnelling multi-photon QWIP according to this invention.

FIG. 1 (b) shows a conduction band diagram of a resonant tunnelling multi-photon QWIP (two photons in this case) according to this invention. (FIG. 1(b), and other figures showing band diagrams, show the band diagram in the presence of an applied voltage so that the band edges are not at a constant energy level.) Here, the energy barriers are much higher than in the conventional QWIP to allow for absorption of more than one photon per transition. In this detection scheme, IR photons excite electrons from the ground state $E_1$ to the excited state $E_3$. This latter energy level is strongly resonant with level $E_4$ in the adjacent quantum well region 100, leading to strong tunnelling of electrons into level $E_4$. (In the embodiment of FIG. 1(*b*) the quantum well region 100 is a multiple quantum well region, but the invention is not limited to the quantum well region 100 being a multiple quantum well region.) This will result in an efficient spatial separation of photo-excited electron from level $E_1$. Electrons may then relax into a low energy state $E_2$ of the second quantum well, which generally is the ground state of the second quantum well, via a non-radiative mechanism (that is, the relaxation of an electron from the level $E_4$ to the low energy state $E_2$ of the second quantum well is not accompanied by emission of a photon). In the example of FIG. 1 the energy difference between levels $E_4$ and $E_2$ is designed to ensure ultrafast scattering of electrons from $E_4$ to $E_2$. Ultrafast scattering (or ultrafast intersubband scattering) is one example of a non-radiative mechanism, and may occur via different mechanisms such as electron-phonon scattering and electron-electron scattering. Arranging for the relaxation of an electron from the level $E_4$ to the low energy state $E_2$ to occur by ultrafast scattering may for example can be achieved by making the energy difference between levels $E_4$ and $E_2$ equal to or larger than LO-phonon energy.

Once electrons relax into level $E_2$ they can then absorb a second IR photon and be excited into level $E_5$ at the top of the quantum well. (It should be noted that the level $E_3$ is a level in the first quantum well (the left handmost quantum well of FIG. 1(*b*)), and that the level $E_4$ is a level in the multiple quantum well region 100. However, the line denoting the level $E_3$ in FIG. 1(*b*) is continued through the potential barrier and into the multiple quantum well region 100 and the line denoting the level $E_4$ in FIG. 1(*b*) is continued through the potential barrier and into the first quantum well—this is to indicate the tunnelling path for electrons from the first quantum well into the multiple quantum well region 100. This is also the case for FIGS. 2(*a*), 3(*a*), 3(*c*), 6(*a*) and 6(*c*) below.)

The dark current in the resonant tunnelling multi-photon QWIP can now be written as:

$$I_{th} \propto \exp\left(-\frac{nV_b}{k_B T}\right) \quad (2)$$

where n is the number of photon absorption stages, and $nV_b$ is the total potential barrier height. The above can also be written as:

$$I_{th} \propto \exp\left(-\frac{V_b}{k_B\left(\frac{T}{n}\right)}\right) = \exp\left(-\frac{V_b}{k_B T_{\it{eff}}}\right) \quad (3)$$

where we regard $$T_{\it{eff}} = \frac{T}{n}$$

as the effective temperature of the detector, and where T is the absolute temperature in K. Hence it can be seen that in two photon absorption stages (n=2) we can double the operating temperature (measured as an absolute temperature) of the detector, compared to a conventional detector with a single photon absorption stage, without affecting the dark current. Similarly, in an embodiment having three photon absorption stages (n=3) the operating temperature of the detector can be tripled, compared to a conventional detector with a single photon absorption stage, without significantly affecting the dark current. This will therefore enable the detector described in this invention to operate at much higher temperatures than conventional QWIPs.

Figure 2A:
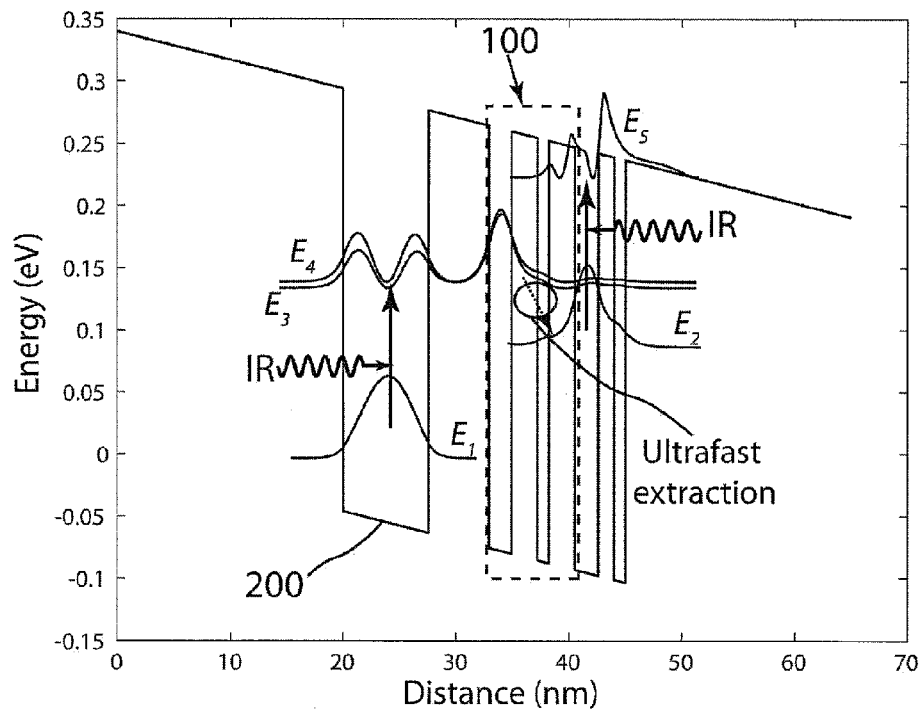
FIG. 2(a) A conduction band diagram of a GaAs/AlGaAs QWIP according to this invention.
Figure 2B:
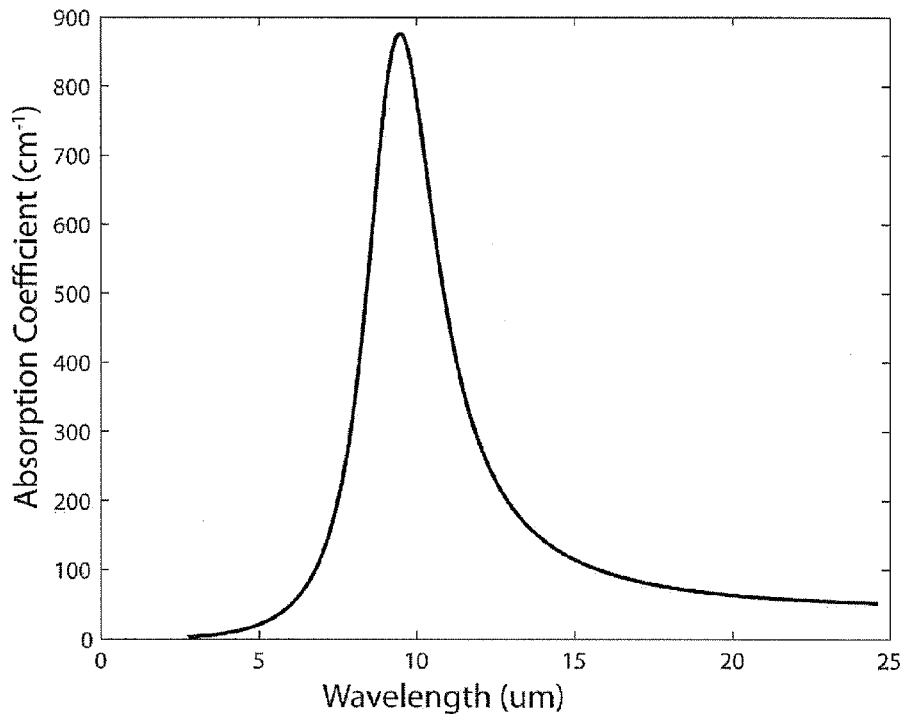
FIG. 2(b) The corresponding absorption spectrum of the GaAs/AlGaAs QWIP structure.
Figure 3A:
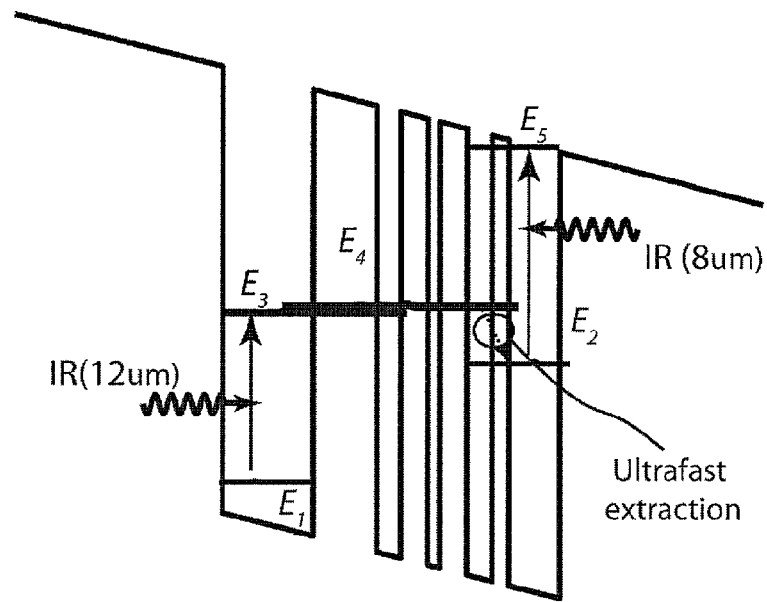
FIG. 3(a) A diagram of multispectral detection QWIP according to this invention.
Figure 3B:
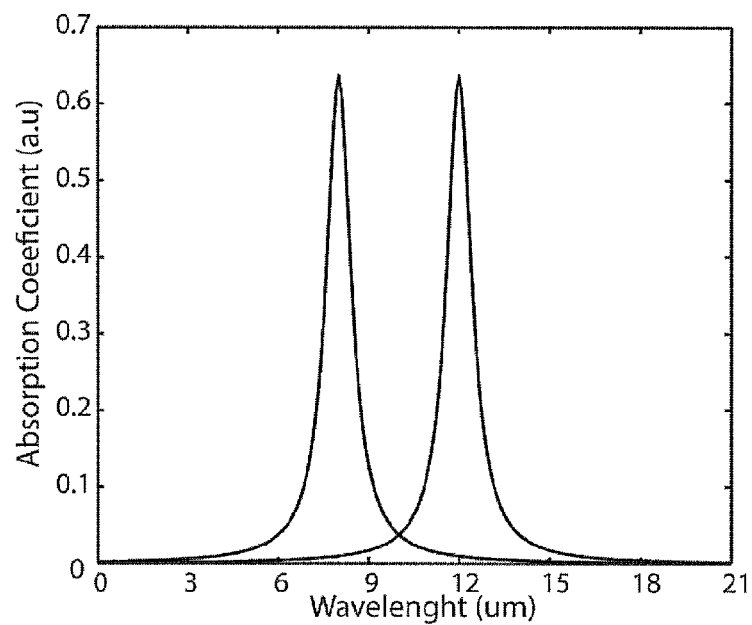
FIG. 3(b) Absorption spectrum corresponding the diagram of multispectral detection QWIP.
Figure 3C:
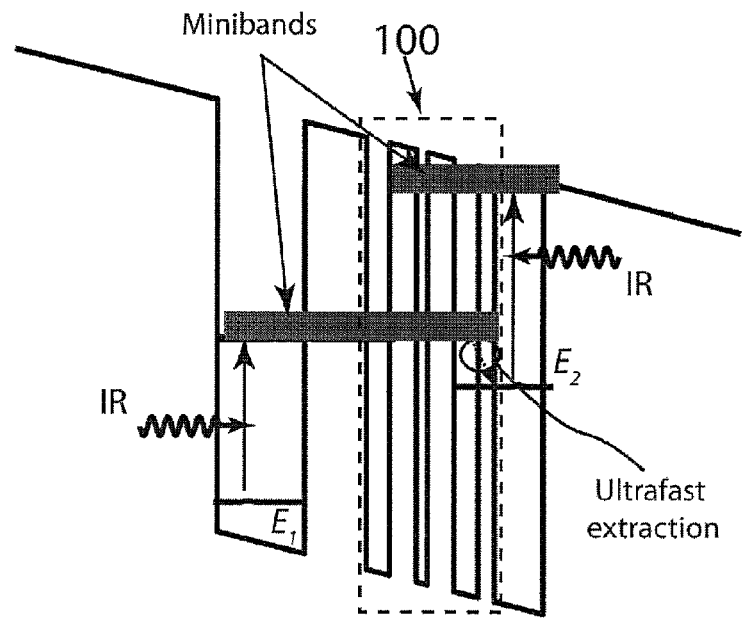
FIG. 3(c) A schematic diagram of an ultra-broad band QWIP according to this invention FIG. 3(d) Absorption spectrum corresponding the schematic diagram of an ultra-broad band QWIP.
Figure 3D:
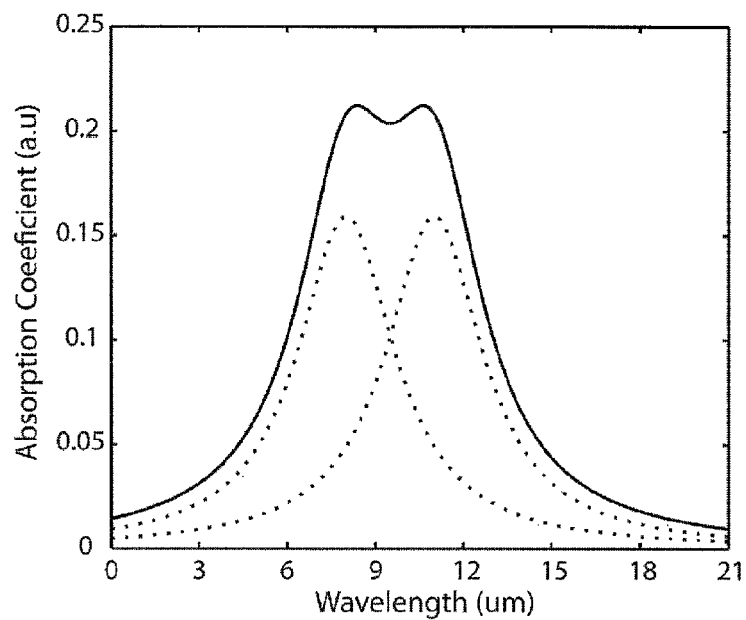

An embodiment of the invention having a conduction band structure as shown in FIG. 2 (*a*), describes a resonant tunnelling multi-photon QWIP structure, designed using GaAs/AlGaAs semiconductor material system. The structure is intended for an operating wavelength of 10 um, and FIG. 2 (*b*) shows the calculated absorption spectrum for a device according to the embodiment of FIG. 2(*a*). As described previously, strong resonance between levels $E_3$ and $E_4$ leads to tunnelling and hence spatial separation of photo-excited electrons from the ground state $E_1$. Once photo-excited electrons tunnel into region 100, ultrafast scattering into level $E_2$ occurs via emission of LO-phonons. This is achieved by making the energy difference between levels $E_4$ and $E_2$ to be equal or slightly larger than 36 meV, the LO-phonon energy in GaAs. In this particular embodiment $E_4-E_2$=40 meV. The lifetime of electrons in level $E_4$ was calculated to as short as 0.7 ps, however a much longer lifetime of more than 100 ps is achieved for electrons in level $E_2$ primarily due to the efficient spatial separation with the ground state $E_1$. This effective spatial separation can be characterized by the overlap integral between states $E_1$ and $E_2$ which is less than $10^{-6}$ in this example. An efficient design will aim to minimize such an overlap integral.

It should be emphasized that the main difference between the device described above and that described in FIG. 9 of U.S. Pat. No. 6,521,967B1 is the fact that our structure relies on a resonant tunnelling stage to extract electrons from level E3 before they relax to the ground state E2 by ultrafast phonon emission. However, in U.S. Pat. No. 6,521,967B1, the relaxation is directly from level E3 to E2 i.e. no resonance extraction stage is present. The disadvantage in this case, is the strong coupling of levels E2 and E1; allowing electrons to relax back to first quantum well before absorbing a second photon. In our proposed structure, such coupling is minimized by the presence of region 100, which also serves to efficiently extract carriers from level 3 via resonant tunnelling.

The layer sequence of the QWIP structure shown in FIG. 2 (*a*) is given in table 1. The active region is repeated 40 times and is sandwiched between top 500 nm and bottom 200 nm n-type contacts ($1 \times 10^{18}$ cm$^{-3}$). The first quantum well 200 in FIG. 2(*a*) is n-type doped ($5 \times 10^{17}$ cm$^{-3}$) to provided carriers necessary for IR absorption. The entire structure can be grown by MBE or MOCVD on a semi-insulating GaAs substrate (SI-GaAs).

TABLE 1

| Repeats | Material | Thickness | Doping (cm$^{-3}$) | Comments |
|---|---|---|---|---|
| — | GaAs | 500 nm | $1 \times 10^{18}$ | N-type Contact |
| | Al$_{0.41}$Ga$_{0.59}$As | 50 nm | — | Barrier |
| x40 | GaAs | 7.6 nm | $5 \times 10^{17}$ | Well |
| | Al$_{0.41}$Ga$_{0.59}$As | 5.3 nm | — | Barrier |
| | GaAs | 2.0 nm | — | Well |
| | Al$_{0.41}$Ga$_{0.59}$As | 2.3 nm | — | Barrier |
| | GaAs | 1.0 nm | — | Well |
| | Al$_{0.41}$Ga$_{0.59}$As | 2.3 nm | — | Barrier |
| | GaAs | 2.1 nm | — | Well |
| | Al$_{0.41}$Ga$_{0.59}$As | 1.4 nm | — | Barrier |
| | GaAs | 1.0 nm | — | Well |
| | Al$_{0.41}$Ga$_{0.59}$As | 50 nm | — | Barrier |
| — | GaAs | 200 nm | $1 \times 10^{18}$ | N-type Contact |
| — | SI—GaAs | 500 μm | — | Substrate |

In the layers in table 1, the 7.6 nm thick GaAs well layer corresponds to the first quantum well 200 of FIG. 2(*a*). The next 4 well layers of table 1 correspond, in sequence to the next 4 quantum wells shown in FIG. 2(*a*). Of these next 4 well layers, the first two well layers (the 2.0 nm thick well layer and the 1.0 nm thick well layer) for the multiple quantum well structure. The next well layer, the 2.1 nm thick GaAs well layer, corresponds to the second quantum well of claim 1, in which the second absorption process between level E2 and level E5 occurs. The final well layer (the second 1.0 nm thick GaAs well layer in table 1) is provided in this embodiment to achieve a structure in the GaAs/AlGaAs system that is absorbing for a wavelength of 10 um wavelength—the effect of providing the fifth quantum well is to push the level E5 up in energy, to maintain absorption at 10 um wavelength. Provision of the fifth quantum well is not an essential feature of the invention, and the fifth quantum well may be omitted. Indeed, provision of the fifth quantum well is not the only way of increasing the energy of the level E5, and similar results could be obtained by other methods such us changing the well and/or barrier thicknesses of the multiple quantum well structure 100.

FIG. 3(*a*) shows a multi-spectral detector according to this invention realized by arranging the different absorption stages to have different energy level separations such that their corresponding absorption spectrums do not substantially overlap. As an example, in FIG. 3(*a*) the first absorption stage which occurs between levels E1 and E3 is centred at 12 um, the second absorption stage which occurs between levels E2 and E5 is centred at 8 um. The corresponding absorption bands are shown in FIG. 3(*b*). FIG. 3(*a*) shows a detector having two photon absorption stages, but the principle of FIG. 3(*a*) may also be applied to a detector having three or more photon absorption stages, by arranging for all the photon absorption stages to have different energy level separations such that their corresponding absorption spectra do not substantially overlap. Detectors having two or more photon absorption stages with corresponding absorption spectra that do not substantially overlap ("multicolour infrared detection", in the case of a detector that absorbs in the infrared region of the spectrum) exhibit the advantage of being more sensitive and easier in distinguishing complicated objects in a complicated background.

QWIPs are characterized with intrinsically narrow absorption line-widths due to the nature of the intersubband absorption process. However, some applications such as infrared spectroscopy require broadband detection. FIG. 3 (*c*) shows a broadband infrared detector, according to this invention, realized by arranging for the energy level separation of the different absorption stages to be slightly different such that their corresponding absorption spectra have a common overlap region. FIG. 3 (*d*) shows the absorption spectrum of the detector in FIG. 3 (*c*). (Again, FIG. 3(*c*) shows a detector with two photon absorption stages, but the principle of FIG. 3(*c*) may also be applied to a detector having three or more photon absorption stages.)

The broadband detection may be further enhanced by introduction of minibands within the multiple quantum well region 100, in order to broad the optical transitions. Since the levels E3 and E4 are strongly resonant with one another, absorption may occur between level E1 and level E4 as well as between level E1 and level E3—hence, making level E4 a miniband will broaden the absorption spectrum. This can be done by increasing the number of quantum wells in region 100 for example. In addition, by incorporating different types of the present QWIP having different but overlapping absorption bands, ultra-broadband detection can be achieved.

Figure 4A:
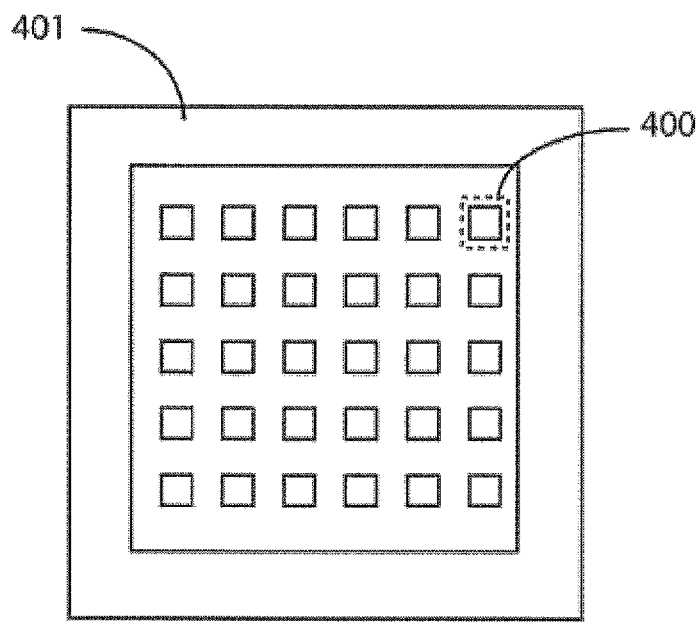
FIG. 4(a) A schematic diagram of a two dimensional QWIP imaging array.
Figure 4B:
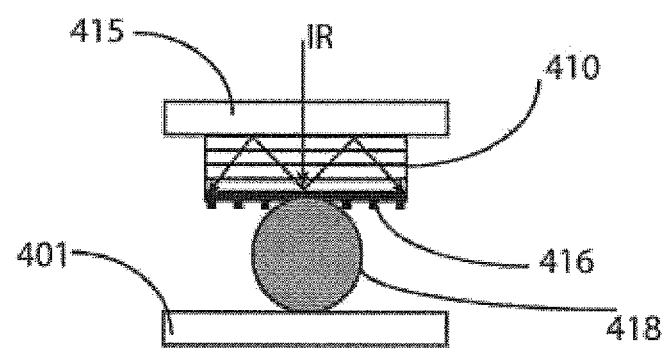
FIG. 4(b) A schematic diagram of the QWIP based pixel.

FIG. 4 (*a*) shows a two dimensional array of QWIP based pixels 400 used for generating infrared images. The device is made of a two dimensional QWIP array which are individually connected to a two dimensional CMOS read out integrated circuit (ROIC) 401 though an indium conducting bump 418. A cross section view of a single pixel in FIG. 4 (*a*) is shown in FIG. 4 (*b*). A QWIP structure 410, as described in this invention, having top and bottom electrical contacts is grown on top of a semiconductor substrate 415. Since the intersubband transition selection rule requires a component of the electric field to be perpendicular to the quantum well layers (TM mode), a two dimensional grating structure or a randomly roughened region 416 is fabricated at the surface of the QWIP to facilitate and allow absorption of IR radiation. Region 416 can also be part of an electrical contact through which the QWIP structure is connected to a ROIC via an indium bump 418. Each individual QWIP pixel generates a signal which is then detected by the underlying ROIC pixel and then processed to form an image. Although the QWIP described herein can work at elevated temperatures; a Peltier cooler can be incorporated to cool the chip down and enhance performance of the imaging array.

Figure 5:
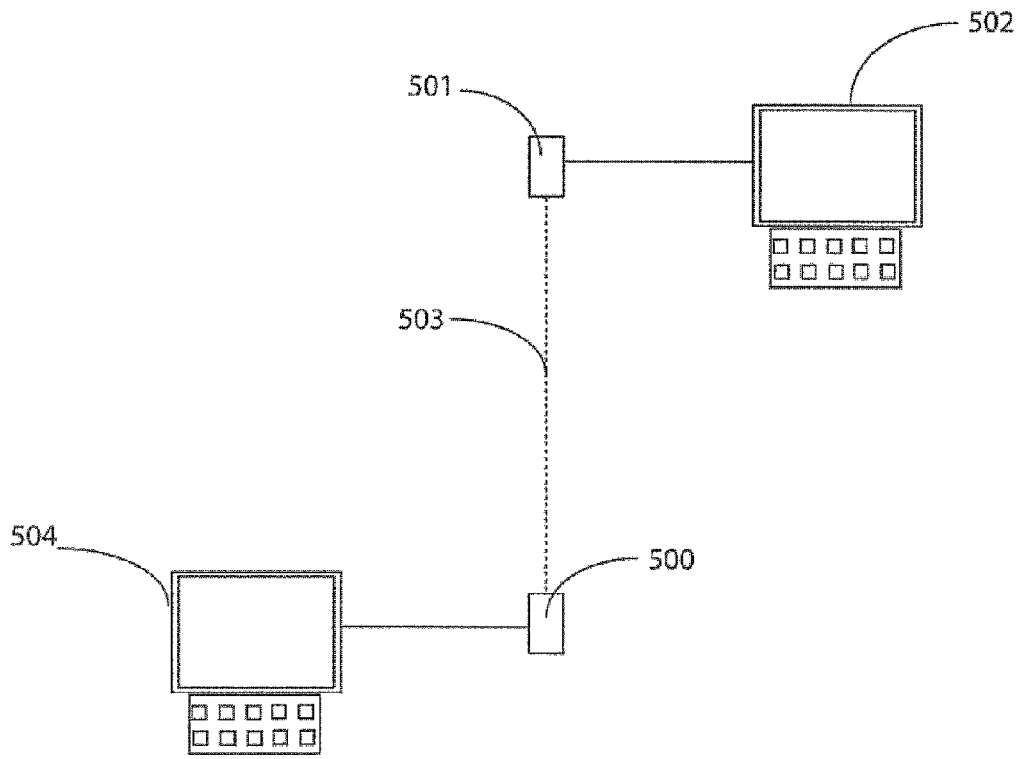
FIG. 5 A schematic diagram illustrating a free space optical communication system having a QWIP, according to this invention, as the optical receiver.

Another embodiment of the invention is realized as described herein with reference to FIG. 5 to form a free space optical communication system. The optical receiver 500 is a QWIP structure as described in this invention. The light emitter 501 is an infrared laser source preferably a quantum cascade laser (QCL) as described for example in U.S. Pat. Nos. 5,457,709, 5,901,168, and 6,148,012. The information in computer unit 502 is used to modulate the IR light output from the QCL laser 501. The modulated IR radiation 503 travels in free space and is detected by the QWIP optical receiver 500. The detected signal is then transmitted to the computer unit 504 for data processing and storage. Coupling of the IR radiation into the QWIP optical receiver can be achieved through a grating structure or a randomly roughened structure fabricated at the surface of the QWIP. Other coupling geometries are also possible and they are well known in the prior art, see for example H. C. Liu et al. Intersubband Transitions in Quantum Wells: Physics and Device Applications I, volume 62. ACADEMIC PRESS, 2000.

The realization of the device described herein can be achieved using a broad range of III-V semiconductor material systems including binary, ternary and quaternary compositions. Furthermore, the performance of the device can be further improved or made to serve specific applications through selecting the composition of the semiconductor layers comprising the device. For example III-V nitride materials are known for their large band gap as well as the possibility to achieve large conduction band offsets. This enables access to short wavelengths <4 um, and allows higher temperature operation. As an example the barriers in our device could be composed of a ternary alloy such as AlGaN or a quaternary alloy such as InGaAlN. The wells could be composed of a binary alloy like GaN, a ternary alloy such as InGaN, or a quaternary alloy.

Further improvements to the device can be realized by means of amplifying the available photocurrent signal. This can be achieved through monolithically integrating a current amplifying device directly with the QWIP. Examples of such current amplification devices are: a Hot Electron Transistor (HET), a Heterostructure Bipolar Transistor (HBT), and High electron mobility transistor (HEMT). Some of these devices have already been investigated in the literature as current amplifying devices in conventional QWIPs, see for example: S. Oktyabrsky et al, IEEE T ELECTRON DEV, 50, 2378, 2003; J. O. Oum et al, IEEE ELECTR DEVICE L, 26, 527, 2005; V. Ryzhii, Jpn. J. Appl. Phys. 36, L415, 1997.

In addition to the electric signal amplification realised by the transistor integration, this scheme is advantageous in the fact that it eliminates the need for an external CMOS read out circuit and allows full scale integration. This makes the entire device more robust against thermal cycling and mechanical shocks.

Furthermore, under the above describe QWIP-Transistor structure; our nonlinear multiphoton QWIP device is ideally suited for the generation of ultrafast transient current in the transistor channel. This transient current can be produced from two infrared sources with close photon frequency or using an infrared pulse. The induced transient current in the transistor channel can excite plasma oscillation allowing high frequency electromagnetic generation, for example in the terahertz region (eg >100 GHz).

Figure 6A:
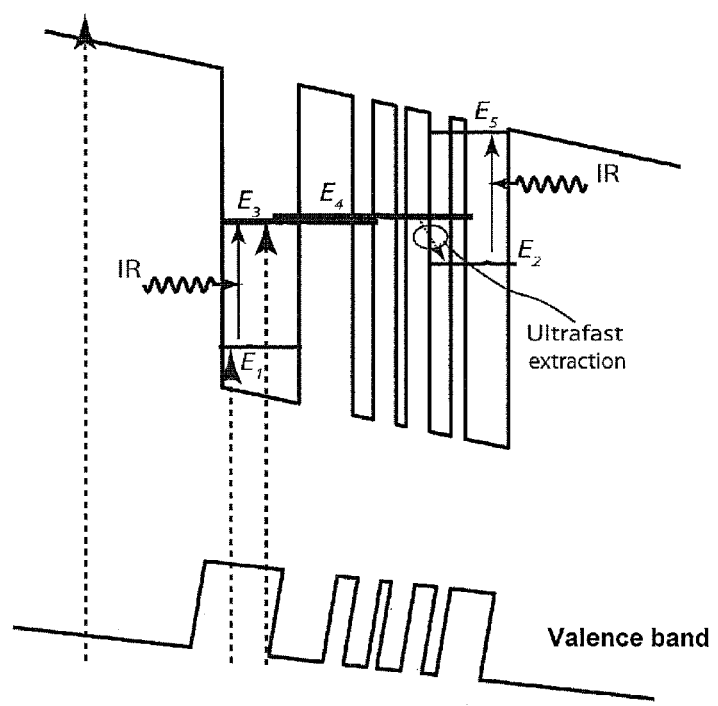
FIG. 6(a) A schematic diagram of an infrared absorbing structure as part of a solar cell device.
Figure 6B:
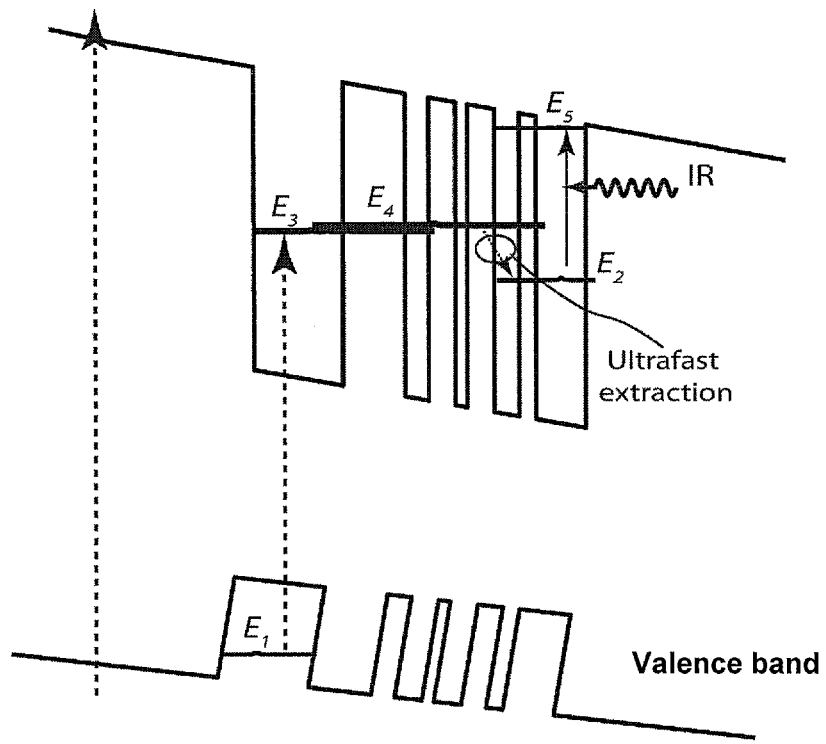
FIG. 6(b) A schematic diagram of an infrared absorbing structure as part of a solar cell device.

Another important application of the device concept, outlined herein, is described in embodiment 6. In FIG. 6 (*a*), our structure is used within a solar cell in order to capture the infrared photons of sunlight. Conventional solar cells are usually transparent to the infrared portion of the electromagnetic spectrum due to material band gap limitations. Hence such infrared photons are lost and their energy cannot be used to improve the efficiency of the solar cell. Our device concept allows such infrared photons to be absorbed efficiently hence improving the efficiency of the solar cell.

In FIG. 6, interband excitations are depicted with dotted arrows. Short wavelength photons excite electrons from the valance band to the conduction band hence populating the electronic levels in the quantum wells. Intersubband transition then takes place between the electronic levels in the multiple quantum well regions as described previously.

In FIG. 6 (*a*), electrons excited to the ground level E1 can spend a long time in that state before being excited to levels E3 and E4 via intersubband transitions. Such an extended lifetime in ground state E1 can significantly increase electron-hole recombination rate hence degrading the solar cell performance. To circumvent this potential problem, an improved design is presented in FIG. 6(*b*). Here, the energy levels in the first quantum well are arranged such that the state E3 that is in resonance with level E4 of the multiple quantum well structure is the ground state of the first quantum well. In this embodiment, absorption of a photon leads to excitation of an electron from a state E1 in the valance band into the level E3 in the first quantum well. Since the level E3 is the ground level of the first quantum well, and is in resonance with the level E4 of the multiple quantum well structure, electrons excited to level E3 can immediately tunnel into the multiple quantum well structure—and the need for the further intersubband transition between level E1 and level E3 of FIG. 6(*a*) is eliminated. Thus, the embodiment of FIG. 6(*b*) can provide fast extraction through resonant tunnelling and subsequent scattering into level E2. Electrons in level E2 can then efficiently absorb infrared radiation thanks to their special separation, as described previously.

The use of intersubband transitions in solar cells to absorb low energy infrared photons can significantly increase the efficiency of the solar cell and provide additional design flexibility in a cost effective approach.

Supplemental Notes

A first aspect of the invention provides a quantum well semiconductor structure comprising: a first quantum well having at least a first state, an energy of the first state being greater than an energy of a lower energy state by a first energy difference; a quantum well structure adjacent to the first quantum well and having at least a second state having an energy level which is resonant with the first state of the first quantum well; and a second quantum well within or adjacent to the quantum well structure, and having at least a third state to collect electrons from the second state of the quantum well structure through a non-radiative mechanism and a fourth state, an energy of the fourth state of the second quantum well being greater than an energy of the third state by a second energy difference.

Where the second quantum well is adjacent to the quantum well structure, it is on the opposite side to the quantum well structure to the first quantum well so that the quantum well structure is between the first quantum well and the second quantum well.

It should be understood that the terms "first", "second", "third" and "fourth" in "first state", "second state", "third state" and "fourth state" are used solely to distinguish the states from one another. The reference to a "first state" in the first quantum well, for example, does not require that the state is the lowest-energy state of the first quantum well, etc.

Figure 7:
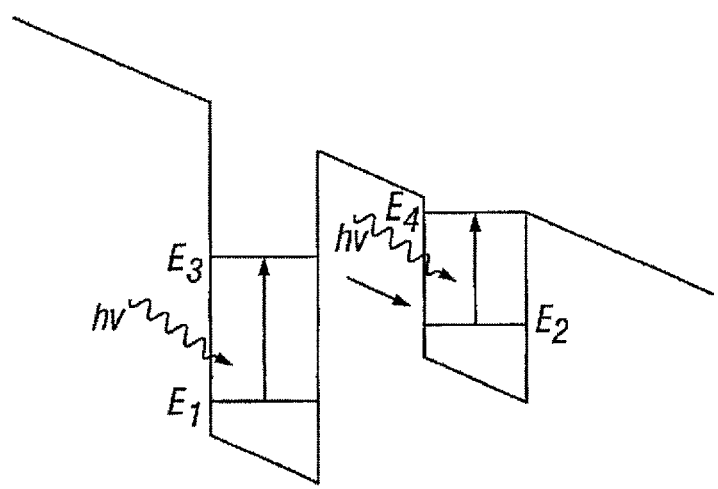
FIG. 7 A schematic diagram of a quantum well infrared detector of U.S. Pat. No. 6,521,967.

From the experience of the inventor, a major problem with the simple double quantum well structure of FIG. 7 is ensuring an efficient carrier extraction from the first excited state of the first quantum well, and at the same time ensuring a long lifetime for the extracted electrons in the ground state of the second adjacent quantum well. The present invention overcomes this by providing the quantum well structure, adjacent to the first quantum well, with a state having an energy level which is resonant with the first state in the first quantum well. Because the quantum well structure has the state which is resonant with the first state in the first quantum well, electrons excited to the first state in the first quantum well by absorption of a first photon are able to tunnel through to the quantum well structure, thus providing efficient extraction of excited carriers from the first quantum well—and this has the effect of spatially separating the excited electrons from the lower energy state from which they were excited to the first state. The excited electrons can then relax to a third state in the second quantum well, such as the ground state of the second quantum well, and then may be excited to the a higher energy state of the second quantum well by absorbing a second photon.

By describing two states as "resonant" with one another is meant that that the two states have similar (but not necessarily identical) energies to one another.

An energy difference between an energy of the second state of the quantum well structure and the energy of the third state of the second quantum well may be equal to or greater than an LO phonon energy in the quantum well structure. This allows electrons in the state of the quantum well structure to relax to the third state of the second quantum well by intersubband scattering, which is a fast process.

The first energy difference may be equal or substantially equal to the second energy difference. Excitation of electrons in the first quantum well and excitation of electrons in the second quantum well thus absorb photons of the same energy as one another, leading to a relatively narrow absorption spectrum with a high maximum absorption.

Alternatively, the first energy difference may be different to the second energy difference. Excitation of electrons in the first quantum well and excitation of electrons in the second quantum well thus absorb photons of different energies, leading to a broad absorption spectrum.

The first energy difference and the second energy difference may correspond to photon energies in the infrared region of the spectrum.

The first state of the first quantum well may comprise a plurality of states forming a miniband. This broadens the range of photon energies that are absorbed by excitation of electrons in the first quantum well, thereby broadening the absorption spectrum.

Additionally or alternatively, the fourth state of the second quantum well may comprise a plurality of states forming a miniband. This broadens the range of photon energies that are absorbed by excitation of electrons in the second quantum well, thereby broadening the absorption spectrum.

The quantum well structure may be a multiple quantum well structure.

The lower energy state may be another state of the first quantum well. Alternatively, the lower energy state may be in a valence band.

The third state of the second quantum well may be a ground state of the second quantum well.

The first state (E3) of the first quantum well may optionally be a bound state of the first quantum well. If the first state of the first quantum well comprises a plurality of states forming a miniband, it may optionally comprise a plurality of bound states forming a miniband.

The second state (E4) of the quantum well structure may optionally be a bound state of the quantum well structure.

The third state (E2) of the second quantum well may optionally be a bound state of the second quantum well, and the fourth state (E5) of the second quantum well may optionally be a bound state of the second quantum well. If the fourth state of the second quantum well comprises a plurality of states forming a miniband, it may optionally comprise a plurality of bound states forming a miniband.

A second aspect of the invention provides an infrared photodetector comprising a semiconductor structure of the first aspect.

The photodetector may further comprise a transistor for current amplification.

The photodetector may further comprise a transistor for high frequency electromagnetic generation.

The transistor may be a monolithically integrated transistor.

A third aspect of the invention provides an imaging array having one or more photodetectors of the second aspect.

A fourth aspect of the invention provides an infrared free space communication system having a receiver comprising a photodetector of the second aspect.

A fifth aspect of the invention provides a solar cell comprising a semiconductor structure of the first aspect.

As noted, it is a goal of the present invention to provide an ultrafast infrared photodetector which overcomes at least some the disadvantage of previous prior art QWIPs, particularly the requirement for very low operating temperatures to achieve high performance. This is provided through a multi-photon absorption detector allowing the device to work at elevated temperature, and at the same time ensures that photo-excited carriers do not scatter back to the ground states thereby reducing the efficiency of the detector. This is achieved through (a) Absorption of a first photon in the first quantum well thereby exciting electrons from a lower energy state to the first excited state of said quantum well.

Adjacent to the first quantum well, is a multiple quantum well structure with at least one state which is strongly resonant with an excited state of the first quantum well. This resonance ensures efficient tunnelling of photo-excited electrons from the first well into the multiple quantum well structure. Hence, spatially separating photo-excited electrons from the ground state in the first quantum well.

(b) Ultrafast extraction of electrons, through intersubband scattering, from the multiple quantum well region to the ground state of a second quantum well.

(c) Absorption of a second photon to excite electrons from the ground state of the second quantum well to an excited state at the top of said quantum well.

A detector in which each of stages (a) to (d) is carried out one provides two photon absorption stages. Further, it is should be noted that it is also be possible to repeat steps (b) and (c) to allow absorption of more than two photons before exciting the electrons to the top of the quantum well, and this makes it possible to provide a detector having three or more photon absorption stages.

The use of a multi-photon detection strategy leads to a significant reduction in the dark current, as a result of using higher barrier potentials, hence permitting the device to work at elevated temperatures. The key aspect of the invention is the spatial separation of photo-excited electrons from the lower energy state, from which electrons were excited to a state in a first quantum well, through resonant tunnelling to an adjacent multiple quantum well structure. Once in the multiple quantum well structure, ultrafast intersubband scattering is used to efficiently transfer electrons to a ground state of a second quantum well where they are ready to absorb another photon. Both the spatial separation and the use of ultrafast intersubband scattering, prevent photo-excited electrons from scattering back to their original ground states, which significantly increase both the efficiency and signal to noise ratio of the detector.

Another advantage of the current invention lies in the fact that thermally excited electrons to intermediate energy levels, can tunnel and scatter quickly to the ground state of adjacent quantum wells. Hence, this thermal population of electrons can now contribute to a measureable signal by abortion of photons. This will further improve the detector efficiency and increase the signal to noise ration of the detector.

Furthermore, if additional high performance and detectivity is required, the current photodetector can be cooled down using inexpensive cooling systems such as thermoelectric (Peltier) cooler. This method of cooling is much less expensive than what is currently used to cool conventional QWIP detectors.

In one embodiment of the invention, an ultra-broad band detector is realized by means of broadening the energy levels through resonantly coupled excited states. Further broadening is also achieved by taking advantage of the multi-photon concept. This is implemented by arranging for the energy level separation of the different absorption stages to be slightly different such that their corresponding absorption spectrums have a common overlap region.

In another embodiment, a multispectral detection is achieved by arranging the different absorption stages to have different energy level separations such that their corresponding absorption spectrums do not substantially overlap.

In one further embodiment, the invention is used as a detector in a free space optical communication system. Due to the nature of the multi-photon absorption scheme used, the present detector is characterized by a nonlinear absorption behaviour, in addition to an ultrafast response capable of femtosecond time resolution; see for example Optics Letters, 30, 28, (2005). This property, coupled with eliminating the need for cryogenic cooling, makes the invention ideal for application in free space optical communication. Furthermore, the infrared radiation, between 3-5 um and 8-12 um, has superior transmission through bad weather conditions, in addition to being inherently eye safe. Therefore, the reliability and efficiency of free space optical communication can be greatly extended by working in this IR transmission windows. However, a critical component of such technology will be based on a high operating temperature ultrafast infrared photodetector, which is one of the objectives of this invention.

In another embodiment the photodetector presented in this invention is used to form an array of two dimensional QWIP elements for the generation of infrared images.

In one further embodiment, the invented structure is used as part of a solar cell device for efficient absorption of infrared radiation. In this scheme, our structure allows the solar cell absorption spectrum to extend down to long wavelength infrared photons which are usually not absorbed due to material band gap limitation. Hence, using our structure, such photons can be absorbed efficiently leading to an increase in the overall efficiency of the solar cell device.

INDUSTRIAL APPLICABILITY

Various applications, particularly in imaging and free space optical communication would be widespread if an ultrafast high operating temperature QWIP device is achieved. The elimination of cryogenic cooling and associated cost is vital for such applications. Other applications of the present invention can be summarized in the following categories:

Industrial infrared imaging including building, electrical and mechanical inspection.

Night vision particularly for automotive industry and various law enforcement and security applications Medical imaging such as measurement of blood flow and body temperature, in addition to early skin and breast cancer detection Remote sensing and pollution monitoring Gas sensing application Furthermore, as described above, the invention can be used to improve the efficiency of conventional solar cells by absorbing the infrared radiation.

In summary, the QWIP device described in the present invention has the advantage of high temperature operation and substantially low dark current. This was achieved through a multi-photon detection strategy where resonant tunnelling was used to spatially separate photo-excited electrons and prevent back scattering to the ground state. Therefore, this invention will help decrease both system cost and power consumption leading to wide spread applications. Other advantages and applications of the present invention were described in exemplary embodiments within this article. Furthermore, it will be understood, by those skilled in the art, that various modifications, additions and alterations may be made to the invention without departing from the spirit and scope of the following claims.

Although the invention has been described with reference to devices which absorb in the infrared portion of the electromagnetic spectrum the invention is not limited to this, and the invention may be applied to devices that absorb in other regions of the electromagnetic spectrum.

In the described embodiment the transition from E4 to E2 has been direct (ie, a single transition). However, the transition between E4 to E2 does not need to be made as a single transition, and the transition can alternatively be made in several steps, for example by emitting an LO phonon in each step. This can be useful for device operation at high temperature, and may also enhance the spatial separation of electrons in state E2 from the first quantum well.

REFERENCE SIGNS LIST

100: A multiple quantum well structure
200: A quantum well
400: A QWIP based imaging pixel
401: CMOS read out integrated circuit (ROIC)
410: QWIP structure
415: Substrate
416: A grating or a rough surface
418: Indium conducting bump
500: QWIP based optical receiver
501: Infrared laser source
502: Computer unit
503: Modulated infrared radiation
504: Computer unit

The invention claimed is:

1. A quantum well semiconductor structure comprising
  a first quantum well having at least a first state (E3), an energy of the first state being greater than an energy of a lower energy state (E1) by a first energy difference;
  a quantum well structure adjacent to the first quantum well and having at least a second state (E4) having an energy level which is resonant with the first state (E3) of the first quantum well; and
  a second quantum well within or adjacent to the quantum well structure, and having at least a third state (E2) to collect electrons from the second state (E4) of the quantum well structure through a non-radiative mechanism and a fourth state (E5), an energy of the fourth state of the second quantum well being greater than an energy of the third state (E2) by a second energy difference.

2. A semiconductor structure as claimed in claim 1 wherein an energy difference between an energy of the second state (E4) of the quantum well structure and the energy of the third state (E2) of the second quantum well is equal to or greater than an LO phonon energy in the quantum well structure.

3. A semiconductor structure as claimed in claim 1 wherein the first energy difference is equal or substantially equal to the second energy difference.

4. A semiconductor structure as claimed in claim 1 wherein the first energy difference and the second energy difference are different to one another.

5. A semiconductor structure as claimed in claim 1 wherein the first energy difference and the second energy difference correspond to photon energies in the infrared region of the spectrum.

6. A semiconductor structure as claimed in claim 1 wherein the first state (E3) of the first quantum well comprises a plurality of states forming a miniband.

7. A semiconductor structure as claimed in claim 1 wherein the fourth state (E5) of the second quantum well comprises a plurality of states forming a miniband.

8. A semiconductor structure as claimed in claim 1 wherein the quantum well structure is a multiple quantum well structure.

9. A semiconductor structure as claimed in claim 1, wherein the lower energy state (E1) is a ground state of the first quantum well.

10. A semiconductor structure as claimed in claim 1, wherein the lower energy state (E1) is in a valence band.

11. A semiconductor structure as claimed in claim 1, wherein the third state (E2) of the second quantum well is a ground state of the second quantum well.

12. An infrared photodetector comprising a semiconductor structure as defined in claim 1.

13. A photodetector as claimed in claim 12 and further comprising a transistor for current amplification.

14. A photodetector as claimed in claim 12 and further comprising a transistor for high frequency electromagnetic generation.

15. A photodetector as claimed in claim 13 wherein the transistor is a monolithically integrated transistor.

16. An imaging array having one or more photodetectors as defined in claim 12.

17. An infrared free space communication system having a receiver comprising a photodetector as defined in claim 12.

18. A solar cell comprising a semiconductor structure as claimed in claim 1.

19. A photodetector as claimed in claim 14 wherein the transistor is a monolithically integrated transistor.

* * * * *